MOS FIELD-EFFECT TRANSISTOR WITH A ONE-MICRON VERTICAL CHANNEL

Filed Dec. 16, 1965

INVENTOR
PHILIPP R. AMLINGER
BY Fishman and Van Kirk
ATTORNEYS

United States Patent Office 3,412,297
Patented Nov. 19, 1968

3,412,297

MOS FIELD-EFFECT TRANSISTOR WITH A ONE-MICRON VERTICAL CHANNEL

Philipp R. Amlinger, Bloomfield, Conn., assignor to United Aircraft Corporation, East Hartford, Conn., a corporation of Delaware
Filed Dec. 16, 1965, Ser. No. 514,207
1 Claim. (Cl. 317—235)

ABSTRACT OF THE DISCLOSURE

An MOS field-effect transistor characterized by a very short, vertically oriented conduction channel. The device has an insulated, gate electrode which extends vertically into the host semi-conductor material a distance greater than the conduction channel which is to be induced between the source and drain regions.

Figures 1, 6:
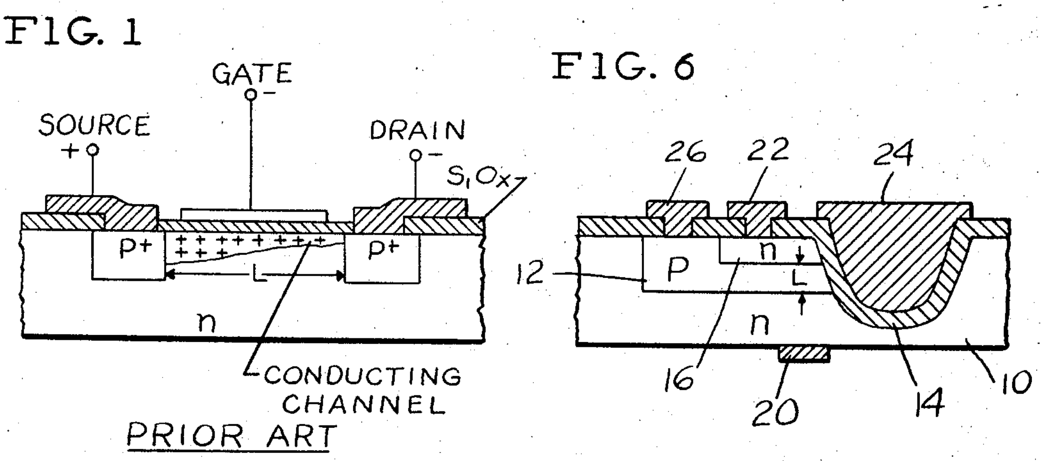

This invention relates to solid state electronics. More particularly, this invention is directed to novel field-effect semiconductor devices and methods of fabricating the same. Accordingly, the general objects of this invention are to provide new and improved methods and devices of such character.

Field-effect semiconductor devices have been known and utilized for some time. An example of a typical prior art field-effect transistor is shown in U.S. Patent No. 3,102,230, issued Aug. 27, 1963, to D. Kahng. For a history of the development of field-effect transistors and for a detailed explanation of the design criteria for such devices, reference may be had to a paper entitled, "The Silicon Insulated-Gate Field-Effect Transistor," by S. R. Hofstein and F. P. Heiman which was published at pages 1190 through 1202 of The Proceedings Of The IEEE, volume 51, No. 9, September 1963; which paper is incorporated by reference into this disclosure.

Field-effect transistors have found wide utility. This is particularly true of induced channel-type devices which have been employed in logical switching units where they usually operate in an enhancement mode. However, whether depletion-type or induced channel-type device, prior art field-effect transistors are characterized by high input resistance and capacitance. Accordingly, previous field-effect transistors have inherently had limited high frequency response. The reason for this poor high frequency response may be readily understood from a study of FIGURE 1 of the accompanying drawing which is a cross-sectional view of a typical prior art induced channel-type field-effect transistor. In the fabrication of devices such as that shown in FIGURE 1, it is difficult if not impossible to obtain a conduction channel length of less than 5 microns (0.2 mil). Channel length L is defined as the length of that region of intrinsic semiconductor material which comes under the effect of the gate electrode and which lies between the source and drain regions. Equations 32 through 39, which appear at pages 1200 and 1201, of the above referenced Hofstein and Heiman paper clearly show that the input capacitance of a field-effect transistor is a function of channel length L and that the frequency response of such devices is thus also a function of channel length. For example, Equation 32 gives the rise time $\tau$ of the output pulses of a simple logical inverter employing a field-effect transistor as:

$$\tau = fR_LC_{in} = f\frac{2L^2}{V_D} = \text{time constant of the stage}$$

where:

$R_L$=load resistance
$\mu$=carrier mobility
$C_{in}$=total input capacitance
$V_p$=pinch-off voltage
$L$=channel length
$f$=fan-out As is well known, rise time is the inverse of frequency. Thus, the maximum switching frequency of a field-effect transistor is inversely proportional to the square of the length of the induced (conduction) channel. Further, as shown by Equation 34 of the paper, drain current and thus the resistance of the devices is simarily affected by channel length. Another way of looking at this problem is that high frequency response is limited by the RC time-constant of the channel. This time constant is proportional to the gate or input capacitance and the source-drain resistance both of which, as respectively indicated by Equations 35 and 34 of the Hofstein-Heiman paper, are inversely proportional to channel length.

The instant invention provides a field-effect semiconductor device characterized by a shorter channel than previously obtainable and thus possessing the capability of operating at higher frequencies than prior art devices. These objects and advantages are realized by dispensing with the horizontally oriented conduction channels of the prior art and, in place thereof, employing a zone of material, which zone will come under the effect of a gate electrode, oriented substantially vertically with respect to the main plane of the host intrinsic semiconductor material.

The foregoing and numerous other advantages and objects of this invention will become obvious to those skilled in the art by reference to the accompanying drawing wherein like reference numerals refer to like elements in the various figures and in which:

FIGURE 1, as noted above, depicts in cross-section a typical prior art induced channel-type field-effect transistor.

FIGURES 2 through 6 are cross-sectional views of the novel field-effect semiconductor device of this invention in various stages of fabrication.

Figure 2:
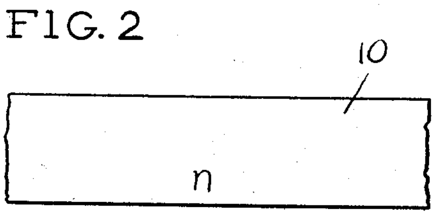

Referring now to FIGURE 2, reference numeral 10 indicates a chip of "n" type semiconductor material. While but a portion of chip 10 has been shown and fabrication of but a single device will be described below, it is to be understood that a large number of devices will usually be simultaneously fabricated from the host material, which devices may either be separated by dicing or interconnected as desired. Thus, while fabrication of a single field-effect transistor will be described, it is to be understood that the packaging density may be as great as 1,000 transistors per square inch or more. Since, in order to facilitate in-diffusion of impurities for doping purposes and because the gate electrode should be electrically isolated from the material in which the conduction channel is to be induced, the host material should be oxidizable. Thus, chip 10 is preferably silicon. As is well known in the art, suitable silicon oxide layers may be formed by oxidizing the surface of silicon semiconductor crystals by heating in an oxidizing atmosphere (for example, nitrogen and steam) or by decomposing chemicals such as silanes on the surface thereof. While the exact stoichiometry of the oxide layers formed by these state-of-the-art techniques is not known, it is presumed that both silicon monoxide and silicon dioxide are present. Thus the silicon oxide layer will here-in-after be referred to by the formula $SiO_x$.

Figure 3:
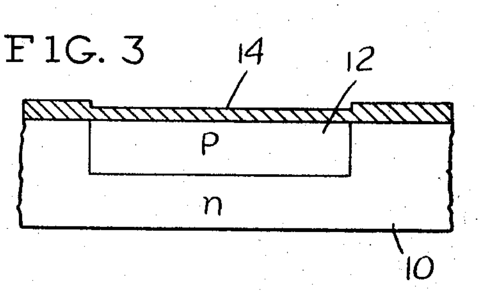
Figure 4:
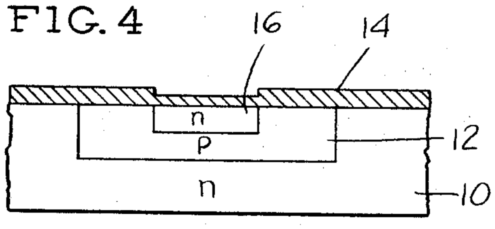

As may be seen from FIGURE 3, the first step in the fabrication of field-effect transistors in accordance with this invention comprises the diffusion into the host material, in a sharply defined region, of an impurity which will convert a portion of the host material to semiconductor material of the opposite conductivity type. In the example being described, since the host material is "n" type material, boron (or some other Group III element) would be a typical "p" type impurity. The techniques for forming zones or regions having the desired surplus of holes or electrons within a body of host semiconductor material are well known in the art and thus will be described but briefly herein. In forming region 12, chip 10 was first surface passivated, by methods well known in the art, so as to form a surface layer 14 of $SiO_x$. The layer of $SiO_x$ 14 may have a thickness of from 2,000 to 10,000 A. Next, the $SiO_x$ was coated with a photosensitive polymerizable material, such as polyvinyl alcohol or a commercially available product sold under the trade name of Kodak Photo Resist by Eastman Kodak Company and believed to be a resinous ester of maleic anhydride and alkoxy hydroxy acetophenone. The layer of photosensitive material was subsequently exposed to light through a high resolution mask. Exposure to light caused the photosensitive material to polymerize. Chip 10 was then developed by rinsing with a solvent, such as Kodak Photo Resist Developer sold by Eastman Kodak Company or methyl ethyl ketone trichlorethylene. The rinsing process resulted in exposure of $SiO_x$ layer 14 in highly defined areas, the rest of the surface being protected by the polymerized material. If desired or deemed necessary, the polymerized photosensitive material may be further polymerized and hardened by baking.

After exposure of the $SiO_x$, a hydrofloric acid etch was employed to uncover the surface of host chip 10 by dissolving the $SiO_x$ from the areas not protected by the photosensitive material. Exposure of the surface of chip 10 permitted the diffusion of the "p" type impurities into the highly defined regions thus laid bare. The impurities are diffused into the surface of chip 10 only where it has been exposed by the hydrofloric acid etch because the layer of $SiO_x$ protects the underlying silicon from the impurity in other regions. During the diffusion process, which is done by the standard technique of heating the chip in the proper atmosphere, a new layer of $SiO_x$ will be formed in the areas where it has been previously etched away. As will be obvious, the steps which have gone into the fabrication of the intermediate of FIGURE 3 have produced a "p-n" junction.

Next, the chip was again masked and etched to provide for the diffusion of an "n" type (Group V element) impurity into a portion of previously formed "p" type region 12. In the example being described, a proper amount of phosphorus was diffused, by conventional methods, into a portion of the boron rich zone through a window formed in the protective $SiO_x$. This second diffusion step produced a zone or region 16 rich in an impurity of the same conductive type as the host material. Thus, a standard "n-p-n" transistor structure, less contacts, was formed by state-of-the-art masking and diffusion techniques. The thickness, in the vertical direction, of that region of "p" type conductivity material lying between "n" type host material and last formed "n" type conductive region 16 may, as is well known, be precisely controlled by controlling the time and temperature of the two aforementioned diffusion steps. Typically, this portion of region 12 will have a thickness of .5 micron. It should be noted that state-of-the-art high frequency transistors of commercially available types have a base width in the neighborhood of .5 micron. Thus, as will be seen from the following description, the base width of conventional high frequency transistors is equal to the length of the conduction channel induced in the field-effect device of this invention.

Figure 5:
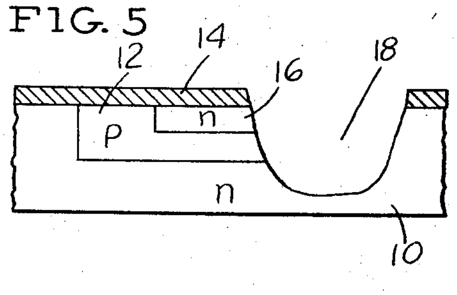

The above described masking procedure was repeated again to remove the protective $SiO_x$ from a portion of the surface of the chip above a portion of regions 16 and 12. The amount of surface of region 12 exposed at this time will depend on the geometry of the previously formed "n-p-n" junction device and its eventual utility. In the example being described, the junction device has been formed in circular geometry and the host chip will ultimately be diced to form a plurality of individual devices. Accordingly, as represented by FIGURES 5 and 6, approximately half of the surface area of region 12 was exposed while but a small portion of the surface of region 16 was exposed. The regions of chip 10 thus exposed were etched with a hydrofloric acid solution to a depth slightly greater than that to which the "p" type material was diffused in the formation of region 12. This produced the structure, shown in cross-section in FIGURE 5, having a cavity 18 therein.

Next, a layer of $SiO_x$ was grown over the semiconductor material exposed during the etching of cavity 18. Thereafter, windows were etched in the surface of $SiO_x$ layer 14 so as to enable communication between the outside world and the remaining portions of regions 12 and 16. In a manner well known in the art, ohmic contacts were made to the semiconductor material through these windows. An ohmic contact was also made to the host material. Thus, a source electrode 20 comprised of vacuum deposited aluminum or other metal and a drain electrode 22 also comprised of vacuum deposited aluminum are provided. After formation of the source and drain electrodes, cavity 18 was filled with a conductive material such as aluminum thereby forming a gate electrode 24. Gate electrode 24 is insulated from region 12 by the layer of $SiO_x$ grown after etching cavity 18. A metal-oxide semiconductor or, as it is commonly known, a MOS field-effect transistor was thus completed by attached leads to the contacts and electrode 24.

As may especially be seen from FIGURE 6, proper biasing of electrodes 20, 22 and 24 results in a field-effect transistor of the induced channel type. In this transistor, current will flow vertically from source electrode 20, through the extremely short conducting channel induced in zone 12 by the potential applied to gate electrode 24, to drain electrode 22. By applying the proper bias to electrode 26, which forms an ohmic contact with region 12, the cut-off bias may be shifted thereby permitting the gate electrode 24 to operate about a preselected reference.

It should especially be noted that electrode 24 forms a "collar" about at least a portion of the drain region 16 and the induced conducting channel in zone 12. This "collar" may completely surround the channel, it may surround a portion of the channel as in the example given, or it may be slotted. Slotting electrode 24 permits the application of different input signals to the segments thereof and thus enables mixing of these inputs within the device.

From the foregoing description, it may be seen that a novel field-effect transistor having a shorter induced conduction channel length than previously available devices of this character has been invented. By shortening the length of the induced channel by a factor of ten, a field-effect transistor having substantially improved high frequency response and improved amplification, when compared to prior art devices, is realized.

Accordingly, while a preferred embodiment has been shown and described, it is to be understood that this invention has been disclosed by way of illustration and not limitation.

What is claimed is:

1. A field-effect transistor comprising:

a wafer of host semiconductor material including at least a first region exhibiting the same conductivity type as the host material and a second region of the host material enriched with an impurity so as to have the opposite conductivity, said first region being separated from said host material by said second region, said second region cooperating respectively with said first region and said host material to form first and second p-n junctions, said second region not exceeding one micron in width in the direction of charge carrier movement therethrough;

electrode means extending into said wafer so as to intersect the planes defined by said junctions;

a dielectric coating separating said electrode means from said host material and first and second regions, said dielectric coating being in intimate contact with said electrode and said material and regions, application of an electrical potential to said electrode means impressing a field across said dielectric coating and inducing a conduction channel in said second region, said conduction channel being oriented substantially vertically with respect to the upper surface of said wafer and extending between said first region and the host material underlying said second region; and means for impressing a voltage across said first and second p-n junctions.

References Cited

UNITED STATES PATENTS

| | | | |
|---|---|---|---|
| 3,339,086 | 9/1967 | Shockley | 307—88.5 |
| 2,899,344 | 9/1959 | Atalla | 148—1.5 |
| 3,204,160 | 9/1965 | Sah | 317—235 |
| 3,206,670 | 9/1965 | Atalla | 323—93 |

JOHN W. HUCKERT, *Primary Examiner.*

M. EDLOW, *Assistant Examiner.*